United States Patent
Ryu et al.

(10) Patent No.: US 10,684,713 B2
(45) Date of Patent: Jun. 16, 2020

(54) DISPLAY DEVICE AND MANUFACTURING METHOD OF THE SAME

(71) Applicant: SAMSUNG DISPLAY CO., LTD., Yongin-si, Gyeonggi-do (KR)

(72) Inventors: Hyeyoung Ryu, Seoul (KR); Yujin Kim, Asan-si (KR); Soyeon Park, Seoul (KR); Yousik Shin, Suwon-si (KR)

(73) Assignee: Samsung Display Co., Ltd. (KR)

( * ) Notice: Subject to any disclaimer, the term of this patent is extended or adjusted under 35 U.S.C. 154(b) by 135 days.

(21) Appl. No.: 15/482,268

(22) Filed: Apr. 7, 2017

(65) Prior Publication Data

US 2017/0293384 A1    Oct. 12, 2017

(30) Foreign Application Priority Data

Apr. 7, 2016    (KR) ................. 10-2016-0042622

(51) Int. Cl.
| | |
|---|---|
| *G06F 3/041* | (2006.01) |
| *G06F 3/044* | (2006.01) |
| *H01L 27/12* | (2006.01) |
| *H01L 29/66* | (2006.01) |
| *G02F 1/1333* | (2006.01) |
| *G02F 1/1343* | (2006.01) |
| *G02F 1/1362* | (2006.01) |
| *H01L 29/786* | (2006.01) |

(52) U.S. Cl.
CPC ........ *G06F 3/0412* (2013.01); *G02F 1/13338* (2013.01); *G02F 1/136286* (2013.01); *G06F 3/044* (2013.01); *H01L 27/124* (2013.01); *H01L 27/1222* (2013.01); *H01L 27/1248* (2013.01); *H01L 27/1288* (2013.01); *H01L 29/66757* (2013.01); *H01L 29/78633* (2013.01); *H01L 29/78675* (2013.01); *G02F 2001/134318* (2013.01); *G02F 2001/136236* (2013.01); *G06F 2203/04103* (2013.01)

(58) Field of Classification Search
CPC ... G06F 3/0412; G06F 3/044; H01L 27/1288; H01L 27/1248; H01L 27/124; H01L 27/1222; H01L 29/78675; H01L 29/78633; H01L 29/66757; G02F 1/13338
See application file for complete search history.

(56) References Cited

U.S. PATENT DOCUMENTS

| | | |
|---|---|---|
| 7,675,580 B2 | 3/2010 | Rho |
| 8,188,982 B2 | 5/2012 | You et al. |

(Continued)

FOREIGN PATENT DOCUMENTS

| | | |
|---|---|---|
| KR | 10-1254695 B1 | 4/2013 |
| KR | 10-2014-0004887 A | 1/2014 |

(Continued)

*Primary Examiner* — Alexander Eisen
*Assistant Examiner* — Kebede T Teshome
(74) *Attorney, Agent, or Firm* — Innovation Counsel LLP

(57) ABSTRACT

A display device includes: a substrate; a touch electrode disposed on the substrate; a routing wiring disposed on the touch electrode; a light blocking layer disposed on the touch electrode; a semiconductor layer disposed on the light blocking layer; a source electrode and a drain electrode spaced apart from each other and disposed on the semiconductor layer; and a gate electrode disposed on the source electrode and the drain electrode.

22 Claims, 16 Drawing Sheets

(56) References Cited

U.S. PATENT DOCUMENTS

| | | | |
|---|---|---|---|
| 2005/0045881 A1* | 3/2005 | Nakamura | G02F 1/1362 257/59 |
| 2014/0011312 A1* | 1/2014 | Roh | H01L 51/0008 438/46 |
| 2014/0166998 A1* | 6/2014 | Lee | H01L 27/323 257/40 |
| 2014/0167040 A1* | 6/2014 | Lee | H01L 29/66969 257/43 |
| 2015/0331530 A1 | 11/2015 | Kim et al. | |
| 2015/0370117 A1* | 12/2015 | Gu | G02F 1/13731 349/33 |
| 2016/0117008 A1 | 4/2016 | Jang | |
| 2017/0069692 A1* | 3/2017 | Lee | H01L 27/323 |
| 2017/0285377 A1* | 10/2017 | Sasaki | G02F 1/133 |
| 2017/0343869 A1* | 11/2017 | Matsumura | G02F 1/1368 |
| 2018/0252956 A1* | 9/2018 | Shin | G06F 3/041 |

FOREIGN PATENT DOCUMENTS

| | | |
|---|---|---|
| KR | 10-1381815 B1 | 4/2014 |
| KR | 10-1513440 B1 | 4/2015 |
| KR | 10-2015-0130620 A | 11/2015 |

\* cited by examiner

DISPLAY DEVICE AND MANUFACTURING METHOD OF THE SAME

CROSS-REFERENCE TO RELATED APPLICATION

This application claims priority under 35 U. S. C. § 119 to Korean Patent Application No. 10-2016-0042622, filed on Apr. 7, 2016, in the Korean Intellectual Property Office (KIPO), the disclosure of which is incorporated by reference herein in its entirety.

1. TECHNICAL FIELD

Exemplary embodiments of the present inventive concept relate to a display device, and more particularly, to a display device capable of reducing the number of masks and to a method of manufacturing the display device.

2. DISCUSSION OF RELATED ART

Flat panel display devices are classified into a liquid crystal display ("LCD") device, an organic light emitting diode ("OLED") display device, a plasma display panel ("PDP") device, an electrophoretic display ("EPD") device, and the like, based on a light emitting scheme thereof.

Among those, an LCD device includes two substrates including electrodes formed thereon and a liquid crystal layer interposed therebetween. Upon applying voltage to the electrodes, liquid crystal molecules of the liquid crystal layer are rearranged such that an amount of transmitted light is controlled in the LCD device. Such an LCD device includes an alignment layer that is capable of aligning liquid crystal molecules so as to uniformly control the liquid crystal layer.

Plane to line switching ("PLS") mode is a type of the LCD devices, in which a pixel electrode and a common electrode are formed on one a substrate to realize a wide viewing angle.

In recent times, a pad portion, which conventionally has been embodied with a bridge electrode in order to implement a narrow bezel and to substantially prevent inflow of static electricity through a contact hole, is formed into a direct contact structure whereby the pad portion overlaps on a vertical line. In addition, an in-cell touch type display device is widely used in which a touch sensor is embedded in the display device to function as a sensing electrode.

However, in order to realize a display device having such a direct contact structure and an in-cell touch structure, an additional process which disadvantageously leads to an increase in manufacturing costs and manufacturing time is required.

The above information disclosed in this Background section is only for enhancement of understanding of the background of the inventive concept, and, therefore, it may contain information that does not form the prior art.

SUMMARY

Exemplary embodiments of the present inventive concept may be directed to a method of manufacturing a display device whereby the number of masks may be reduced while employing both a direct contact structure and an in-cell touch structure, and to a display device manufactured by the method.

According to an exemplary embodiment, a display device includes: a substrate; a touch electrode disposed on the substrate; a routing wiring disposed on the touch electrode; a light blocking layer disposed on the touch electrode; a semiconductor layer disposed on the light blocking layer; a source electrode and a drain electrode spaced apart from each other and disposed on the semiconductor layer; and a gate electrode disposed on the source electrode and the drain electrode.

The display device may further include: a first electric field generating electrode connected to the drain electrode; and a second electric field generating electrode insulated from the first electric field generating electrode.

The display device may further include: a lower wiring disposed below the gate electrode, the lower wiring including a substantially same material as a material forming the first electric field generating electrode.

The gate electrode may directly contact the lower wiring.

The display device may further include: an organic layer disposed on the source electrode and the drain electrode.

The organic layer may not be disposed on a channel area between the source electrode and the drain electrode.

The organic layer may not be disposed on a contact hole through which the drain electrode and the first electric field generating electrode are connected.

The routing wiring and the light blocking layer may include a substantially same material.

The touch electrode may directly contact the light blocking layer.

The first electric field generating electrode may be a surface electrode.

The second electric field generating electrode may include a stem portion and branch portions obliquely extending from the stem portion.

According to an exemplary embodiment, a method of manufacturing a display device includes: forming a touch electrode a routing wiring and a light blocking layer on a substrate, the routing wiring and the light blocking layer being disposed on the touch electrode and connected to the touch electrode; forming a semiconductor layer on the light blocking layer; forming a source electrode and a drain electrode spaced apart from each other on the semiconductor layer; forming an organic layer on the source electrode and the drain electrode; and forming a gate electrode on the source electrode and the drain electrode.

The forming the gate electrode further includes forming a first electric field generating electrode connected to the drain electrode.

The method may further include forming a second electric field generating electrode insulated from the first electric field generating electrode and overlapping the first electric field generating electrode.

The forming a touch electrode, the routing wiring, and the light blocking layer may include: sequentially forming a touch electrode forming material, a routing wiring and light blocking layer forming material, and a photoresist layer over the substrate; exposing the photoresist layer using a mask including a light transmissive portion, a semi-light transmissive portion, and a light blocking portion; developing the exposed photoresist layer; etching the touch electrode forming material and the routing wiring and light blocking layer forming material using the developed photoresist layer as a mask; ashing the developed photoresist; and partially etching the routing wiring and light blocking layer forming material using the ashed photoresist layer as a mask.

The forming the organic layer may include: forming an organic layer forming material over the source electrode and the drain electrode; exposing the organic layer forming material using a mask including a light transmissive portion, a semi-light transmissive portion, and a light blocking portion; developing the exposed organic layer forming material; exposing the drain electrode using the developed organic layer forming material as a mask; and ashing the developed organic layer forming material on a channel area between the source electrode and the drain electrode.

The forming a gate electrode may include: sequentially forming a first electric field generating electrode forming material and a gate electrode forming material over the source electrode and the drain electrode; forming a photoresist layer over the gate electrode forming material; exposing the photoresist layer using a mask including a light transmissive portion, a semi-light transmissive portion, and a light blocking portion \; developing the exposed photoresist layer; etching the first electric field generating electrode forming material and the gate electrode forming material using the developed photoresist layer as a mask; partially ashing the developed photoresist layer; and etching the gate electrode forming material using the ashed photoresist layer as a mask.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present inventive concept will become more apparent by describing in detail exemplary embodiments thereof with reference to the accompanying drawings, wherein.

DETAILED DESCRIPTION

Figure 1A:
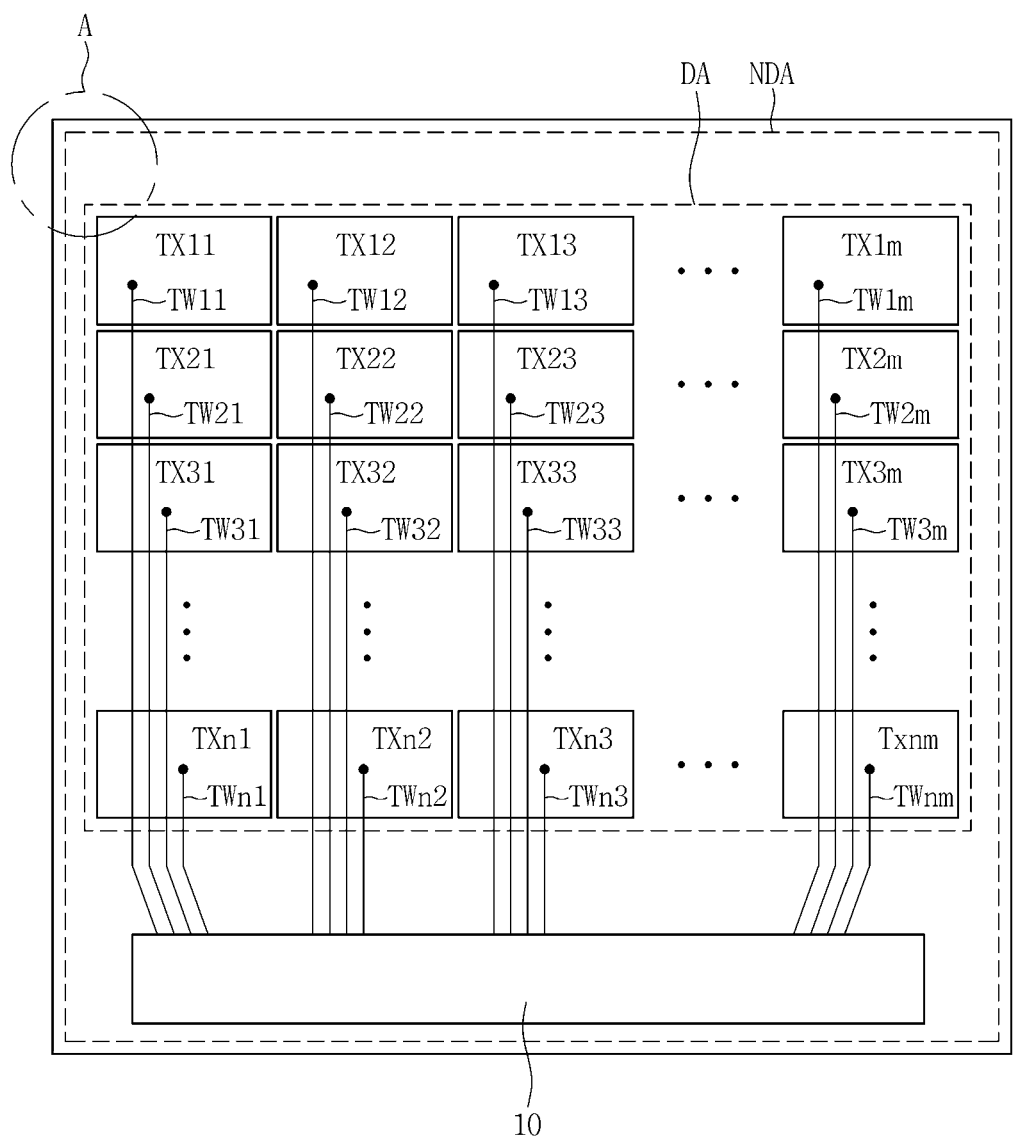
FIG. 1A is a schematic plan view illustrating a display device according to an exemplary embodiment.

Exemplary embodiments will now be described more fully hereinafter with reference to the accompanying drawings. Although the inventive concept can be modified in various manners and have several embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present inventive concept, and like reference numerals refer to like elements throughout the specification.

Figure 1B:
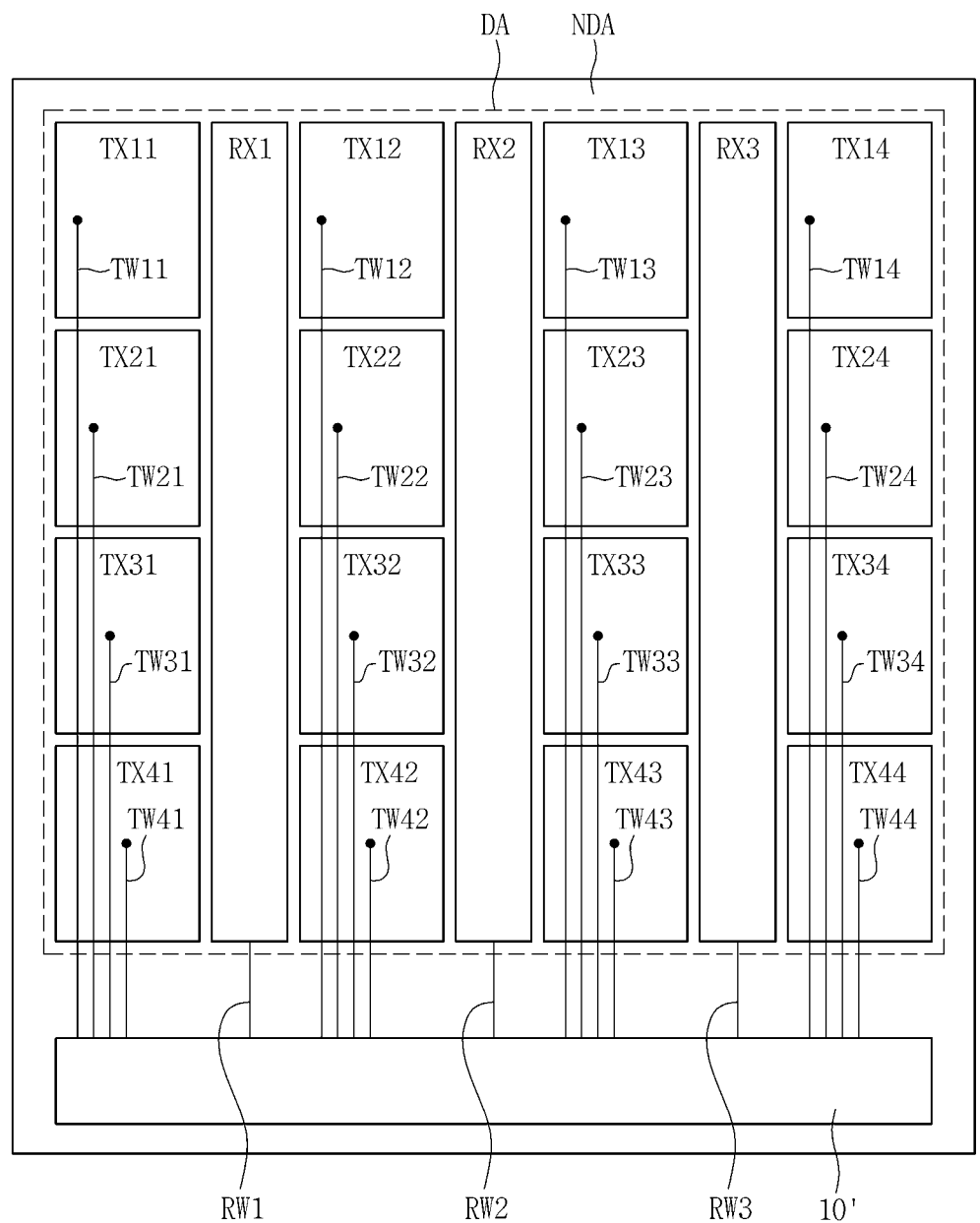
FIG. 1B is a schematic plan view illustrating a display device according to an alternative exemplary embodiment.

FIG. 1A is a schematic plan view illustrating a display device according to an exemplary embodiment, and FIG. 1B is a schematic plan view illustrating a display device according to an alternative exemplary embodiment.

Referring to FIG. 1A, the display device according to an exemplary embodiment includes a display area DA and a non-display area NDA. A plurality of touch electrodes TX11 to TXnm arranged in a matrix and a plurality of routing wirings TW11 to TWnm connected to the plurality of touch electrodes TX11 to TXnm, respectively, are disposed at the display area DA and a touch sensing integrated circuit ("IC") 10 is disposed at the non-display area NDA.

The touch sensing IC 10 applies a touch driving voltage to the plurality of touch electrodes TX11 to TXnm and thereafter scans a change in electrostatic capacitance of the touch electrodes TX11 to TXnm before and after a touch action, thereby determining a position at which the touch action is performed.

Referring to FIG. 1B, the display device according to an alternative exemplary embodiment includes a plurality of first touch electrodes TX11 to TX41, TX12 to TX42, TX13 to TX43, and TX14 to TX44 arranged in one direction, a plurality of first routing wirings TW11 to TW41, TW12 to TW42, TW13 to TW43, and TW14 to TW44 respectively connected to the first touch electrodes TX11 to TX41, TX12 to TX42, TX13 to TX43, and TX14 to TX44, a plurality of second touch electrodes RX1 to RX3 arranged between adjacent first touch electrodes TX11 to TX41, TX12 to TX42, TX13 to TX43, and TX14 to TX44 arranged in another direction substantially perpendicular to the one direction, and a plurality of second routing wirings RW1 to RW3 respectively connected to the second touch electrodes RX1 to RX3.

A touch sensing IC 10' sequentially applies a touch driving voltage to the first touch electrodes TX11 to TX41, TX12 to TX42, TX13 to TX43, and TX14 to TX44, and thereafter scans a change in electrostatic capacitance among the second touch electrodes RX1 to RX3 before and after a touch action, thereby determining a position at which the touch action is performed.

However, exemplary embodiments are not limited to the above two exemplary embodiments, and any commonly employed type of touch electrodes may be applied in the present inventive concept.

Figure 2:
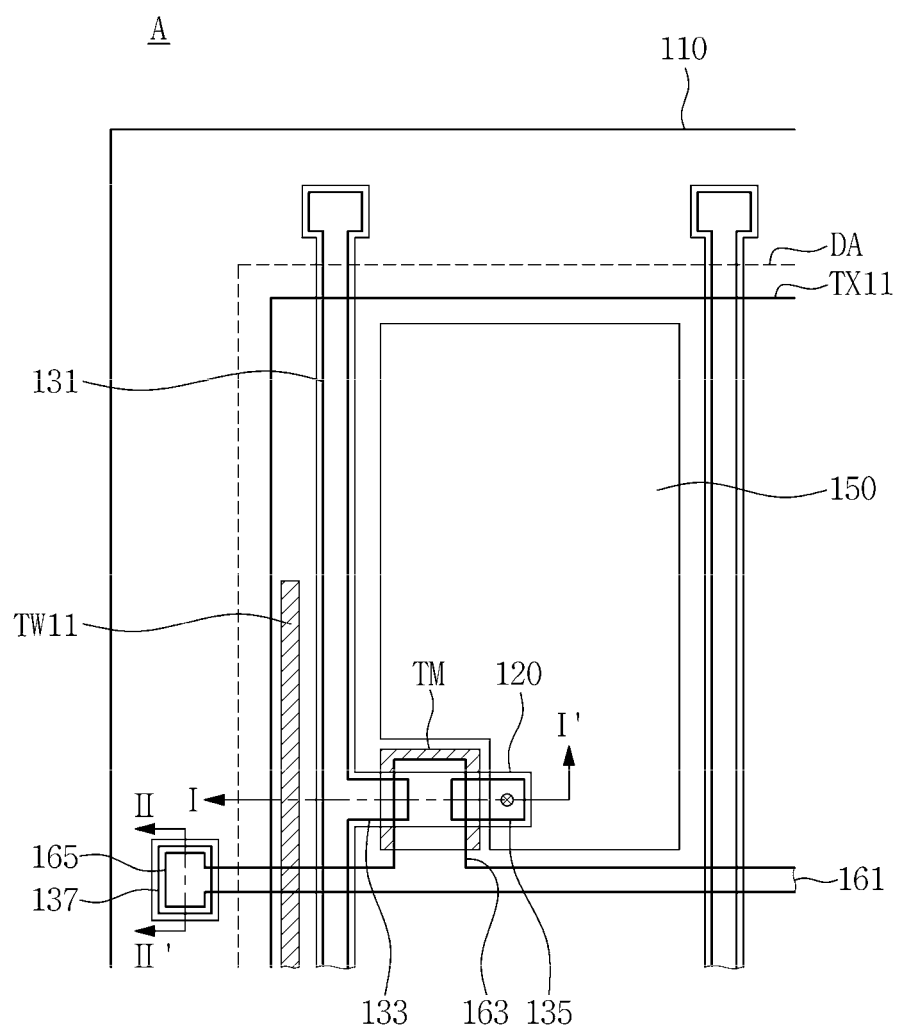
FIG. 2 is an enlarged view illustrating area "A" in FIG. 1A.
Figure 3:
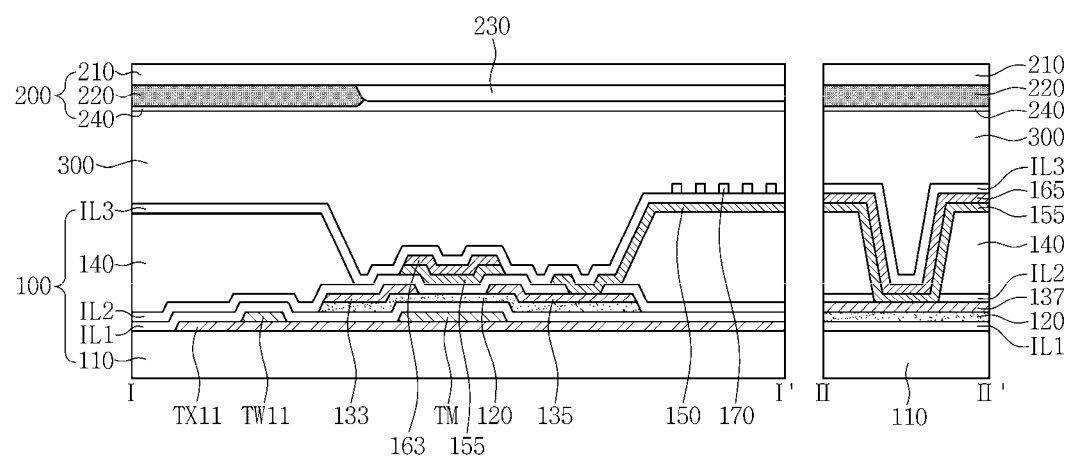
FIG. 3 is a cross-sectional view taken along lines I-I' and II-II' of FIG. 2.

FIG. 2 is an enlarged view illustrating area "A" in FIG. 1A, and FIG. 3 is a cross-sectional view taken along lines I-I' and II-II' of FIG. 2.

Referring to FIGS. 1A, 1B, 2, and 3, the display device according to an exemplary embodiment includes a display substrate 100, an opposing substrate 200, and a liquid crystal layer 300 interposed between the display substrate 100 and the opposing substrate 200. In addition, the display device according to an exemplary embodiment may further include a backlight unit (not illustrated) that outputs light toward the display substrate 100.

The display substrate 100 includes a first substrate 110, a touch electrode TX11, a routing wiring TW11, a light blocking layer TM, a first insulating layer IL1, a semiconductor layer 120, a data wiring 131, 133, 135, and 137, a second insulating layer IL2, an organic layer 140, a first electric field generating electrode 150, a gate wiring 161, 163, and 165, a third insulating layer IL3, a second electric field generating electrode 170, and the like.

The first substrate 110 may be an insulating substrate, e.g., a plastic substrate, having light transmitting characteristics and flexible characteristics. However, exemplary embodiments are not limited thereto, and the first substrate 110 may include a hard substrate such as a glass substrate.

The first substrate 110 includes a display area DA at which the touch electrode TX11 and the routing wiring TW11 connected to the touch electrode TX11 are disposed, and a non-display area NDA which surrounds the display area DA.

The touch electrode TX11 may include a metal or a transparent conductive material. Such a transparent conductive material may be a transparent conductive oxide ("TCO"). Examples of the TCO may include indium tin oxide (ITO), indium zinc oxide (IZO), zinc oxide (ZnO), and the like, which may be used solely or in combination with one another.

The routing wiring TW11 and the light blocking layer TM are disposed on the first substrate 110 on the touch electrodes TX11. The routing wiring TW11 and the light blocking layer TM may be directly connected to the touch electrodes TX11.

The routing wiring TW11 may connect the touch electrode TX11 and the touch sensing IC 10 to each other. The light blocking layer TM may be disposed below a channel area between a source electrode and a drain electrode, to be described below, to block light incident to the channel area from the backlight unit.

The light blocking layer TM may externally receive a ground voltage or a storage voltage. Further, the light blocking layer TM may be floated, not receiving any voltage from the outside.

The light blocking layer TM may include a material that may absorb and block light. For example, the light blocking layer TM may include or be formed of at least one selected from the group consisting of: aluminum (Al) or alloys thereof, silver (Ag) or alloys thereof, copper (Cu) or alloys thereof, molybdenum (Mo) or alloys thereof, chromium (Cr), tantalum (Ta), and titanium (Ti). In an exemplary embodiment, the routing wiring TW11 and the light blocking layer TM may include a substantially same material and may be formed in substantially a same process.

The first insulating layer IL1 is disposed on the first substrate 110 on which the routing wiring TW11 and the light blocking layer TM are disposed. The first insulating layer IL1 may include silicon oxide (SiOx) or silicon nitride (SiNx). In addition, the first insulating layer 130 may further include aluminum oxide, titanium oxide, tantalum oxide, or zirconium oxide.

The semiconductor layer 120 and the data wiring 131, 133, 135, and 137 are disposed on the first insulating layer IL1. The semiconductor layer 120 and the data wiring 131, 133, 135, and 137 may substantially overlap one another.

The semiconductor layer 120 may be amorphous silicon (a-Si), poly-crystalline silicon (poly-Si), or oxide semiconductor. In exemplary embodiments of the present inventive concept, the semiconductor layer 120 will be described on the premise that it is a poly-Si.

The data wiring 131, 133, 135 and 137 includes a data line 131 extending in one direction, a source electrode 133 branching off from the data line 131, a drain electrode 135 spaced apart from the source electrode 133, and a pad electrode 137 at an area overlapping a gate pad portion to be described below.

The data line 131 transmits a data signal. The source electrode 133 and the drain electrode 135, along with a gate electrode 163 to be described below, form three terminals of a thin film transistor ("TFT").

The data wiring 131, 133, 135, and 137 may include or be formed of at least one selected from the group consisting of: aluminum (Al) or alloys thereof, silver (Ag) or alloys thereof, copper (Cu) or alloys thereof, molybdenum (Mo) or alloys thereof, chromium (Cr), tantalum (Ta), and titanium (Ti).

In addition, the data wiring 131, 133, 135, and 137 may have a multilayer structure including at least two conductive layers (not illustrated) having different physical properties. For example, a conductive layer of the multilayer structure may include or be formed of a metal, e.g., an aluminum (Al)-based metal, a silver (Ag)-based metal, and a copper (Cu)-based metal, which has low resistivity to reduce signal delay or voltage drop. Further, another conductive layer of the multilayer structure may include a material, e.g., a molybdenum-based metal, chromium, titanium, and tantalum, which is found to impart excellent contact properties with ITO and IZO.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the data wiring 131, 133, 135, and 137 may include various kinds of metals and conductors.

The semiconductor layer 120 and the data wiring 131, 133, 135, and 137 may be simultaneously formed in substantially a same process.

The second insulating layer IL2 is disposed on the first substrate 110 on which the semiconductor layer 120 and the data wiring 131, 133, 135, and 137 are disposed.

The second insulating layer IL2 may include silicon oxide (SiOx) or silicon nitride (SiNx). In addition, the second insulating layer IL2 may further include aluminum oxide, titanium oxide, tantalum oxide, or zirconium oxide.

The organic layer 140 is disposed on the second insulating layer IL2. The organic layer 140 may have a thickness ranging from about 1.0 μm to about 3.5 μm.

The organic layer 140 according to an exemplary embodiment is not disposed in the channel area between the source electrode 133 and the drain electrode 135 and also is not disposed in a connection area between the drain electrode 135 and the first electric field generating electrode 150 to be described below. Similarly, the organic layer 140 is not disposed in a connection area between the pad electrode 137 and a gate pad portion 165 to be described below.

The first electric field generating electrode 150 is disposed on the organic layer 140. The first electric field generating electrode 150 is connected to the drain electrode 135 through a contact hole formed through the second insulating layer IL2.

In an exemplary embodiment, the first electric field generating electrode 150 may be a surface electrode. In addition, the first electric field generating electrode 150 may include a transparent conductor such as ITO and IZO.

Subsequently, the gate wiring 161, 163, and 165 is disposed. The gate wiring 161, 163, and 165 includes a gate line 161 applying a gate signal, a gate electrode 163 branching off from the gate line 161 and overlapping the channel area between the source electrode 133 and the drain electrode 135, and the gate pad portion 165 connecting the gate line 161 and a gate IC (not illustrated).

The gate pad portion 165 is connected to the pad electrode 137 through a contact hole formed through the second insulating layer IL2.

The gate wiring 161, 163, and 165 may include a substantially same material as that included in the aforementioned data wirings 131, 133, 135, and 137. In addition, a lower wiring 155 including a substantially same material as that included in the aforementioned first electric field generating electrode 150 may be disposed below the gate wiring 161, 163, and 165 except a region on which the first electric field generating electrode 150 is formed. That is, the gate wiring 161, 163, and 165 and the lower wirings 155 may have a substantially same shape and directly contact one another except a region on which the first electric field generating electrode 150 is formed.

The third insulating layer IL3 is disposed on the first substrate 110 on which the first electric field generating electrode 150 and the gate wiring 161, 163, and 165 are disposed.

The third insulating layer IL3 may include silicon oxide (SiOx) or silicon nitride (SiNx). In addition, the first insulating layer 130 may further include aluminum oxide, titanium oxide, tantalum oxide, or zirconium oxide.

The second electric field generating electrode 170 is disposed on the third insulating layer IL3 to overlap the first electric field generating electrode 150. In the display device according to an exemplary embodiment, the second electric field generating electrode 170 may have a shape including a stem portion and branch portions extending obliquely with respect to the stem portion, and may include a transparent conductor such as ITO and IZO.

The opposing substrate 200 includes a second substrate 210, a light blocking member 220, a color filter 230, an overcoat layer 240, and the like.

The second substrate 210 may be an insulating substrate including transparent materials such as plastic or glass, e.g., soda lime glass or borosilicate glass.

The light blocking member 220 and the color filter 230 are disposed on the second substrate 210.

The light blocking member 220 defines an opening area through which light is transmitted. The light blocking member 220 is also referred to as a black matrix, and defines a pixel area. The light blocking member 220 may include a metal, such as chromium oxide (CrOx), or an opaque organic layer material, for example.

The color filter 230 is disposed in an area surrounded by the light blocking member 220 to overlap the light blocking member 220. The color filter 230 may have one of colors of: red, green, blue, cyan, magenta, yellow, and white. Three basic colors, such as red, green, and blue, or cyan, magenta, and yellow, may form a basic pixel group for forming a color.

The overcoat layer 240 is disposed on the light blocking member 220 and the color filter 230. The overcoat layer 240 serves to planarize an uneven surface of a layer therebelow, such as the light blocking member 220 and the color filter 230, or to prevent elution of impurities from the layer therebelow.

FIGS. 4A, 4B, 4C, and 4D are plan views illustrating a method of manufacturing a display device according to an exemplary embodiment, and FIGS. 5A, 5B, 5C, 5D, 5E, 5F, 5G, 5H, 5I, 5J, 5K, 5L, 5M, 5N, 5O, and 5P are cross-sectional views illustrating a method of manufacturing a display device according to an exemplary embodiment.

The method of manufacturing a display device according to an exemplary embodiment includes forming a touch electrode TX11 on a first substrate 110, forming a routing wiring TW11 and a light blocking layer TM connected to the touch electrode TX11 on the touch electrode TX11, forming a semiconductor layer 120 on the light blocking layer TM, forming a source electrode 133 and a drain electrode 135 to be spaced apart from each other on the semiconductor layer 120, forming an organic layer 140 on the source electrode 133 and the drain electrode 135, and forming a gate electrode 163 on the source electrode 133 and the drain electrode 135.

In addition, the method of manufacturing a display device according to an exemplary embodiment may further include forming a first electric field generating electrode 150 connected to the drain electrode 135 and forming a second electric field generating electrode 170 arranged to be insulated from the first electric field generating electrode 150.

A method of forming the touch electrode TX11, the routing wiring TW11, and the light blocking layer TM on the first substrate 110 will be described with reference to FIGS. 4A, 5A, 5B, 5C, 5D, and 5E.

Figure 4A:
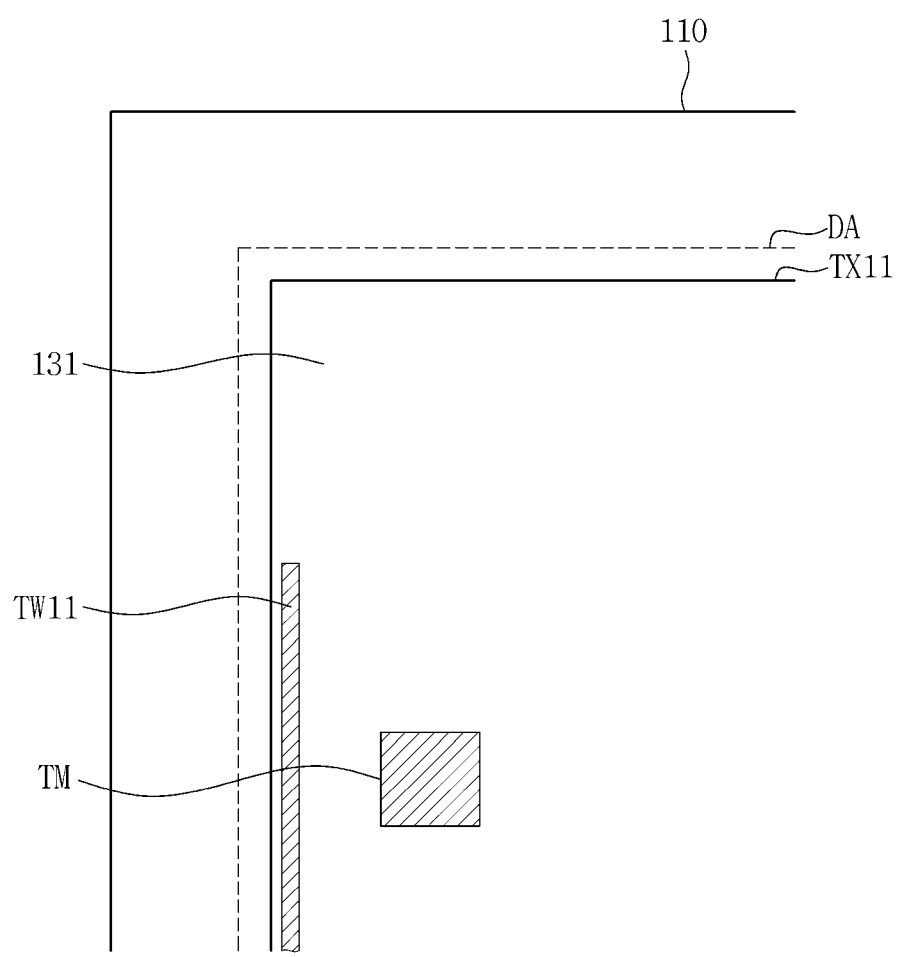
FIGS. 4A, 4B, 4C, and 4D are plan views illustrating a method of manufacturing a display device according to an exemplary embodiment.
Figure 5A:
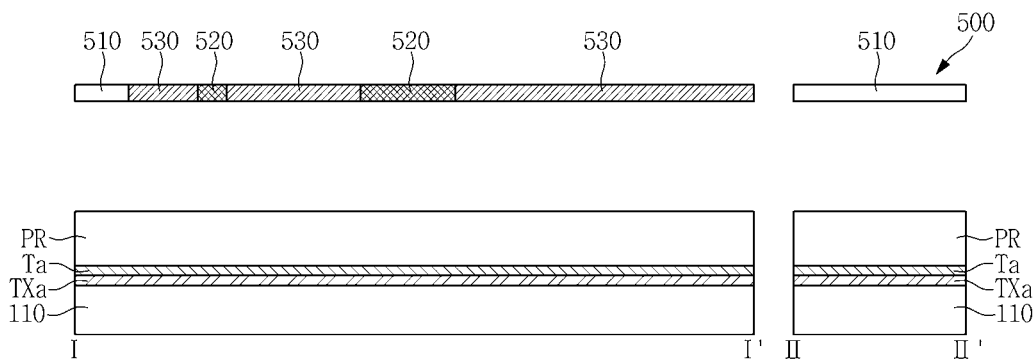
FIGS. 5A, 5B, 5C, 5D, 5E, 5F, 5G, 5H, 5I, 5J, 5K, 5L, 5M, 5N, 5O, and 5P are cross-sectional views illustrating a method of manufacturing a display device according to an exemplary embodiment.

Referring to FIGS. 4A and 5A, a touch electrode forming material TXa and a routing wiring and light blocking layer forming material Ta are sequentially formed over the first substrate 110. In the present exemplary embodiment, it is assumed that the routing wiring TW11 and the light blocking layer TM include substantially a same material.

The touch electrode forming material TXa may be, for example, ITO, IZO, and ZnO.

The routing wiring and light blocking layer forming material Ta may include opaque conductive materials. The opaque conductive material may be at least one selected from the group consisting of: aluminum (Al) or alloys thereof, silver (Ag) or alloys thereof, copper (Cu) or alloys thereof, molybdenum (Mo) or alloys thereof, chromium (Cr), tantalum (Ta), and titanium (Ti).

The touch electrode forming material TXa and the routing wiring and light blocking layer forming material Ta may be formed through one of the following methods: an ion beam deposition process, a spin coating process, a printing process, a sputtering process, a chemical vapor deposition process, an atomic layer deposition process, a plasma enhanced chemical vapor deposition process, a high density plasma-chemical vapor deposition process, or a vacuum deposition process.

Subsequently, photoresist PR is coated over the routing wiring and light blocking layer forming material Ta. The photoresist PR may be a positive type photosensitive resin or a negative type photosensitive resin. Hereinafter, it is assumed that the photoresist PR is a positive type photoresist of which an exposed area is developed and a non-exposed area remains.

The photoresist PR may include a binder resin, a polymerizable monomer, a polymerizable oligomer, a pigment, a dispersant, and a photo initiator. The pigment may use a black pigment or a black resin.

Subsequently, a mask 500 is disposed above the photoresist PR, spaced apart from the photoresist PR, and light is irradiated to the photoresist PR through the mask 500 to perform light exposure. The mask 500 is a three-tone mask including a light transmissive portion 510, a light blocking portion 520, and a semi-light transmissive portion 530, each having different light transmittances. In an alternative exemplary embodiment, the mask 500 may have a slit portion in lieu of the semi-light transmissive portion 530.

The light transmissive portion 510 may have a light transmittance of about 95% or more, the light blocking portion 520 may have a light transmittance of about 5% or less, and the semi-light transmissive portion 530 may have a light transmittance ranging from about 15% to about 20%.

The light transmissive portion 510 is disposed at an area absent the touch electrode TX11, for example, above the non-display area NDA, the light blocking portion 520 is disposed above an area at which the routing wiring TW11 and the light blocking layer TM are formed, and the semi-light transmissive portion 530 is disposed above an area at which only the touch electrode TX11 is formed.

Figure 5B:
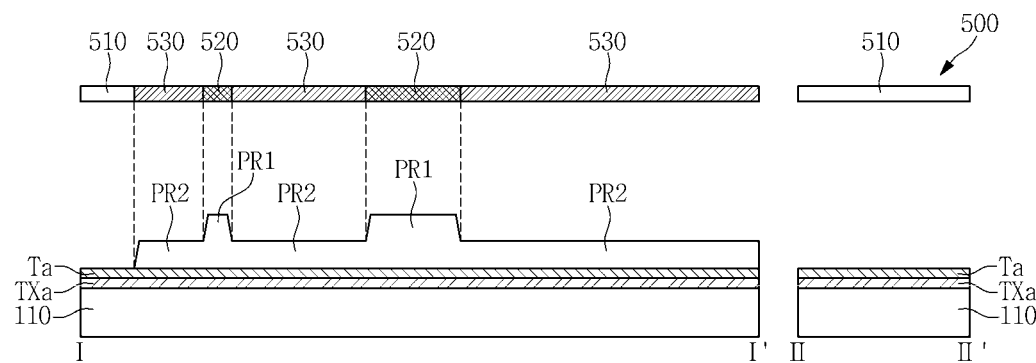

Referring to FIGS. 4A and 5B, the photoresist PR below the light transmissive portion 510 is completely developed, and the photoresist PR below the light blocking portion 520 is not developed and cured as it is such that a first etching prevention layer PR1 is formed.

The photoresist PR below the semi-light transmissive portion 530 is partially developed and cured such that a second etching prevention layer PR2 is formed. Accordingly, the first etching prevention layer PR1 may have a greater thickness than that of the second etching prevention layer PR2. Due to the first etching prevention layer PR1 and the second etching prevention layer PR2, a portion of the routing wiring and light blocking layer forming material Ta is not exposed.

Figure 5C:
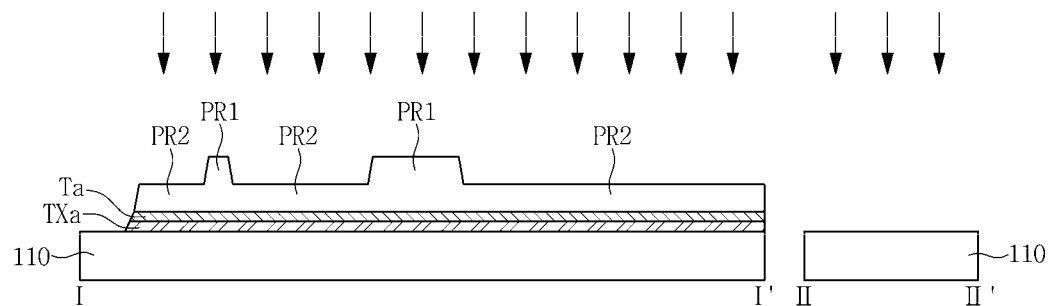

Referring to FIGS. 4A and 5C, the exposed routing wiring and light blocking layer forming material Ta is etched, and thereafter the exposed touch electrode forming material TXa is etched. The routing wiring and light blocking layer forming material Ta and the touch electrode forming material TXa may be etched through wet etching. Then, the first etching prevention layer PR1 and the second etching prevention layer PR2 are partially removed through an ashing process.

Figure 5D:
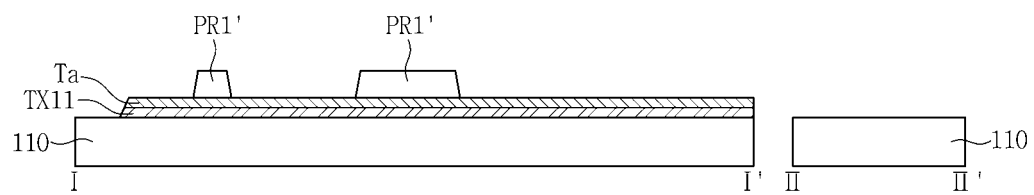

Referring to FIGS. 4A and 5D, the first etching prevention layer PR1 is partially removed such that a residual etching prevention layer PR1' is formed. The second etching prevention layer PR2 is completely removed such that the residual etching prevention layer PR1' is selectively formed on an area corresponding to the routing wiring TW11 and the light blocking layer TM.

Figure 5E:
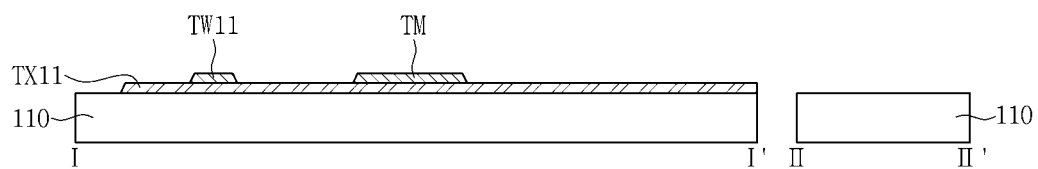

Referring to FIGS. 4A and 5E, the exposed routing wiring and light blocking layer forming material Ta is etched such that the routing wiring TW11 and the light blocking layer TM are formed.

Figure 4B:
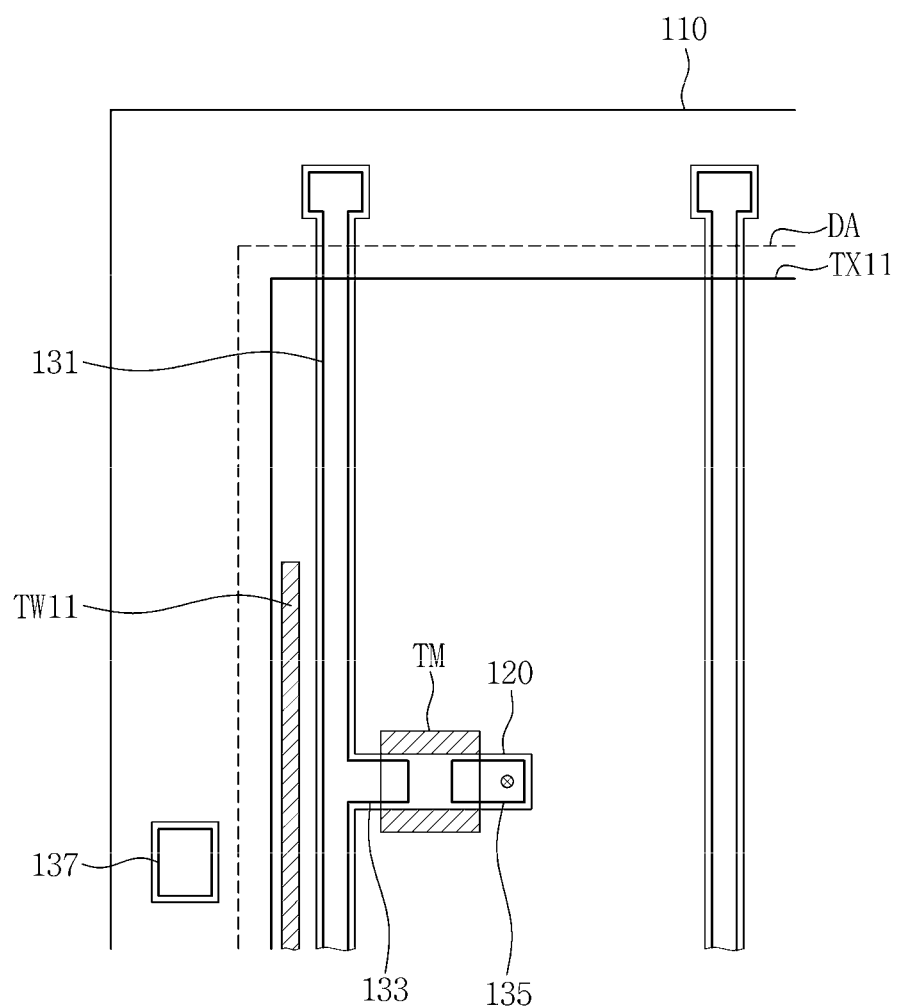
Figure 5F:
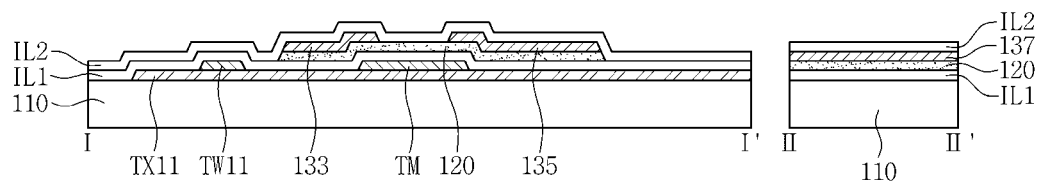

Referring to FIGS. 4B and 5F, a first insulating layer IL1 is formed over the first substrate 110 on which the touch electrode TX11, the routing wiring TW11, and the light blocking layer TM are formed. The semiconductor layer 120 and a data wiring 131, 133, 135, and 137 are formed. The semiconductor layer 120 and the data wiring 131, 133, 135, and 137 may be simultaneously formed in a substantially same process using a three-tone mask. Subsequently, a second insulating layer IL2 is formed over the first substrate 110 on which the semiconductor layer 120 and the data wiring 131, 133, 135, and 137 are formed.

Referring to FIGS. 4C, 5G, 5H, 5I, and 5J, a process of forming the organic layer 140 on the second insulating layer IL2 will be described.

Figure 4C:
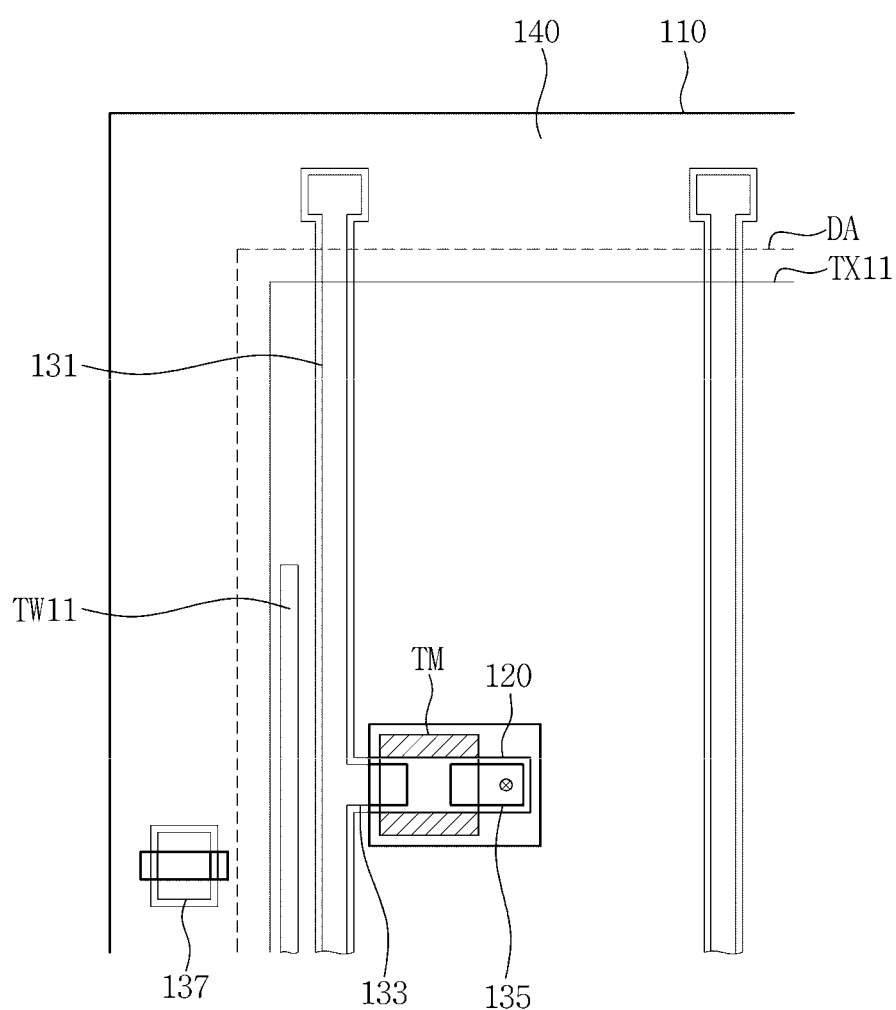
Figure 5G:
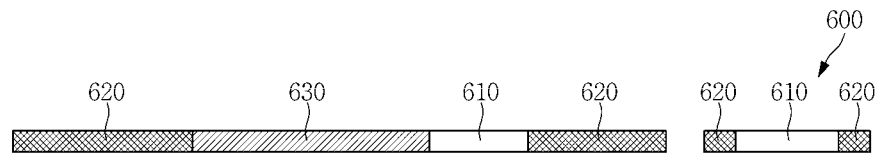
Figure 5G:
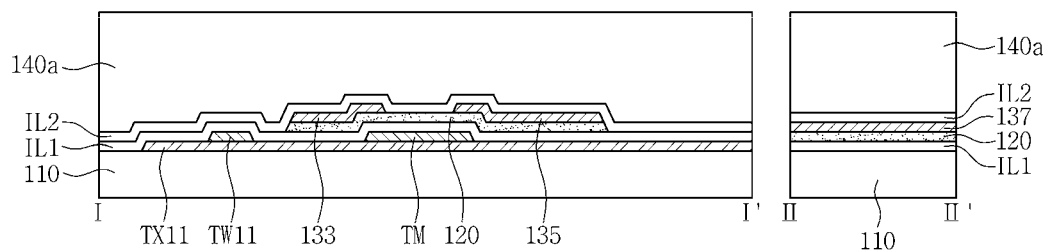

Referring to FIGS. 4C and 5G, an organic layer forming material 140a is formed over the second insulating layer IL2. Subsequently, a mask 600 is disposed above the organic layer forming material 140a, spaced apart from the organic layer forming material 140a. A light is irradiated to the organic layer forming material 140a through the mask 600 to perform light exposure. The mask 600 is a three-tone mask including a light transmissive portion 610, a light blocking portion 620, and a semi-light transmissive portion 630, each having different light transmittances.

The light transmissive portion 610 is disposed above the drain electrode 135 and above a pad electrode 137, the semi-light transmissive portion 630 is disposed above a channel area, and the light blocking portion 620 is disposed above a remaining area.

Figure 5H:
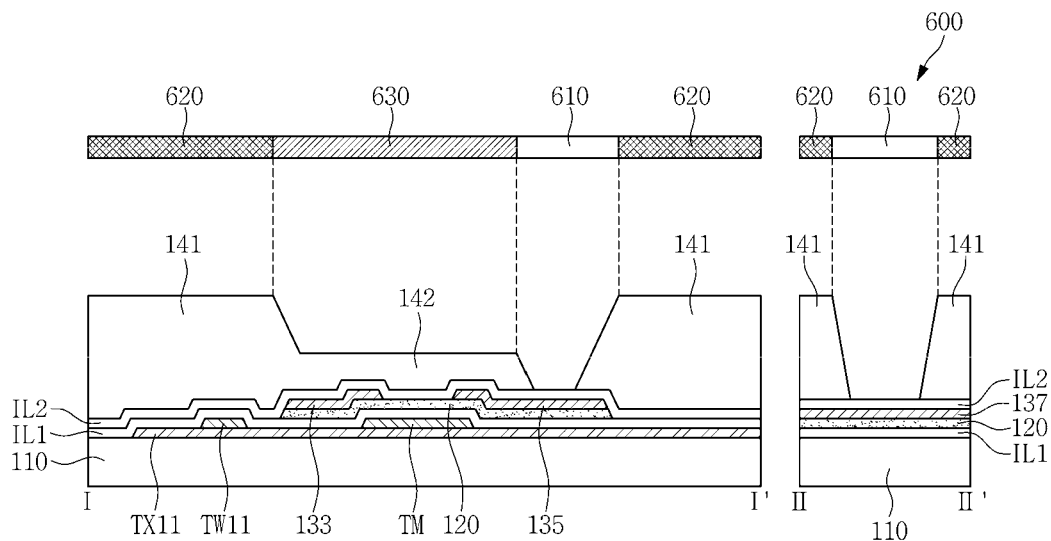

Referring to FIGS. 4C and 5H, the organic layer forming material 140a below the light transmissive portion 610 is completely developed, and the organic layer forming material 140a below the light blocking portion 620 is not developed and cured as it is such that a first organic layer 141 is formed. The organic layer forming material 140a below the semi-light transmissive portion 630 is partially developed and cured such that a second organic layer 142 is formed. The first organic layer 141 may have a thickness greater than that of the second organic layer 142.

Figure 5I:
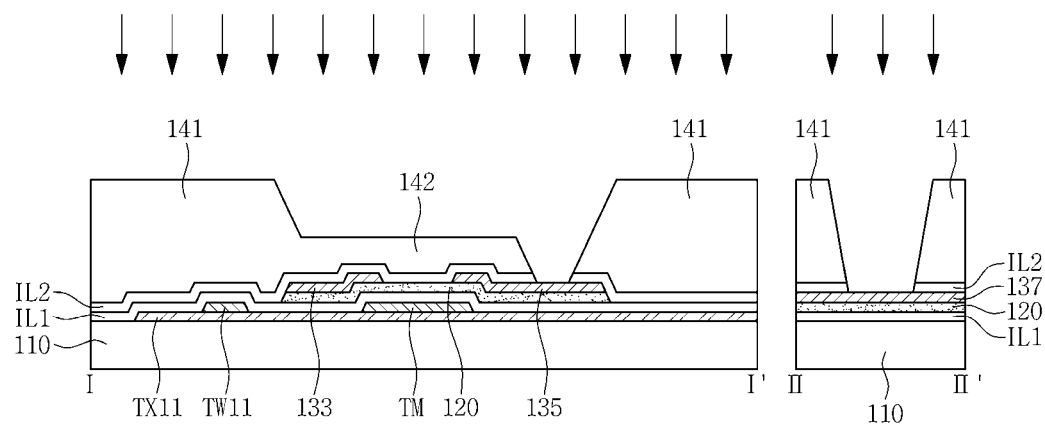

Referring to FIGS. 4C and 5I, the exposed second insulating layer IL2 is etched. The second insulating layer IL2 may be etched through dry etching. Then, the first organic layer 141 and the second organic layer 142 are partially removed through an ashing process.

Figure 5J:
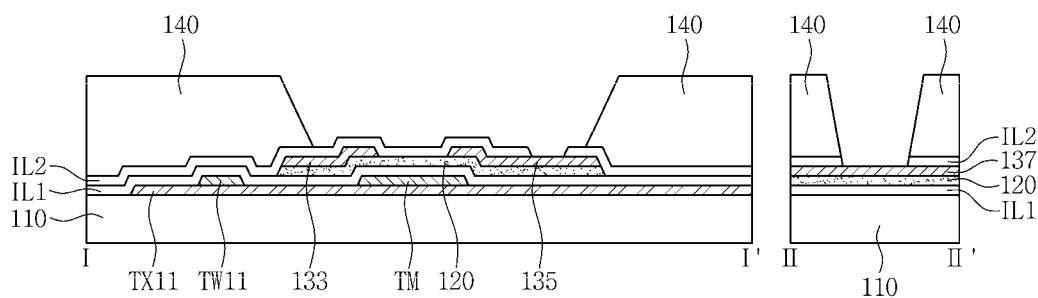

Referring to FIGS. 4C and 5J, the first organic layer 141 is partially removed such that the organic layer 140 is formed, and the second organic layer 142 is completely removed. That is, the organic layer forming material 140a does not remain above the drain electrode 135, above the pad electrode 137, and above the channel area.

A method of forming the first electric field generating electrode 150 and a gate wiring will be described with reference to FIGS. 4D, 5K, 5L, 5M, 5N, and 5O.

Figure 4D:
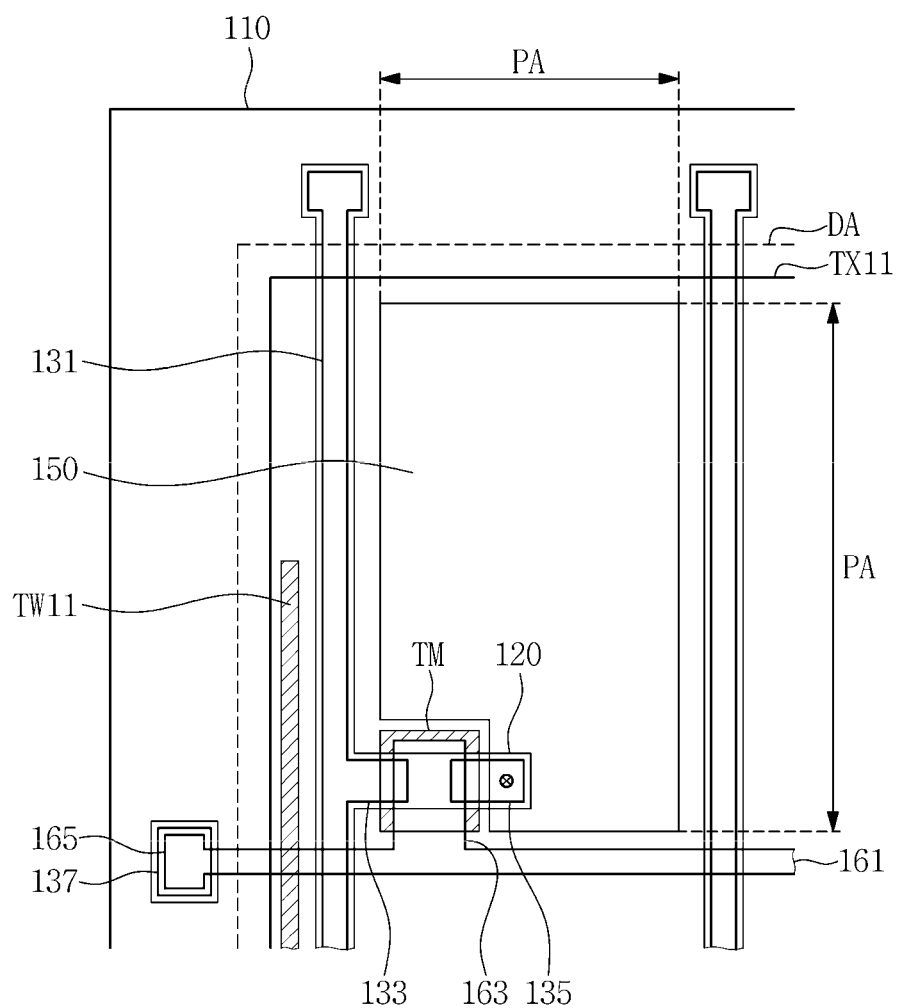
Figure 5K:
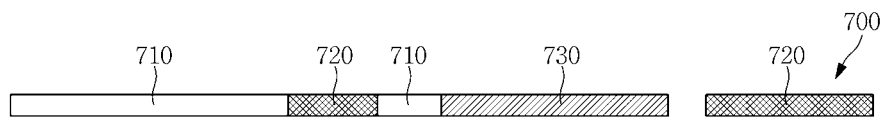
Figure 5K:
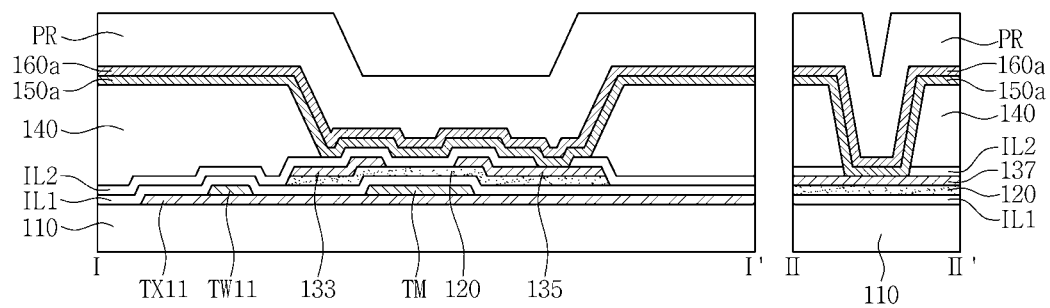

Referring to FIGS. 4D and 5K, a first electric field generating electrode forming material 150a, a gate wiring forming material 160a, and a photoresist PR are sequentially formed over the first substrate 110 on which the organic layer 140 is formed.

The first electric field generating electrode forming material 150a may use, for example, ITO, IZO, and ZnO.

The gate wiring forming material 160a may include at least one selected from the group consisting of: aluminum (Al) or alloys thereof, silver (Ag) or alloys thereof, copper (Cu) or alloys thereof, molybdenum (Mo) or alloys thereof, chromium (Cr), tantalum (Ta), and titanium (Ti).

Subsequently, a mask 700 is disposed above the photoresist PR, spaced apart from the photoresist PR, and a light is irradiated to the photoresist PR through the mask 700 to perform light exposure. The mask 700 is a three-tone mask including a light transmissive portion 710, a light blocking portion 720, and a semi-light transmissive portion 730, each having different light transmittances.

The light transmissive portion 710 is disposed above an area between the channel area and a pixel area PA, the semi-light transmissive portion 730 is disposed above the pixel area PA, and the light blocking portion 720 is disposed above a remaining area.

Figure 5L:
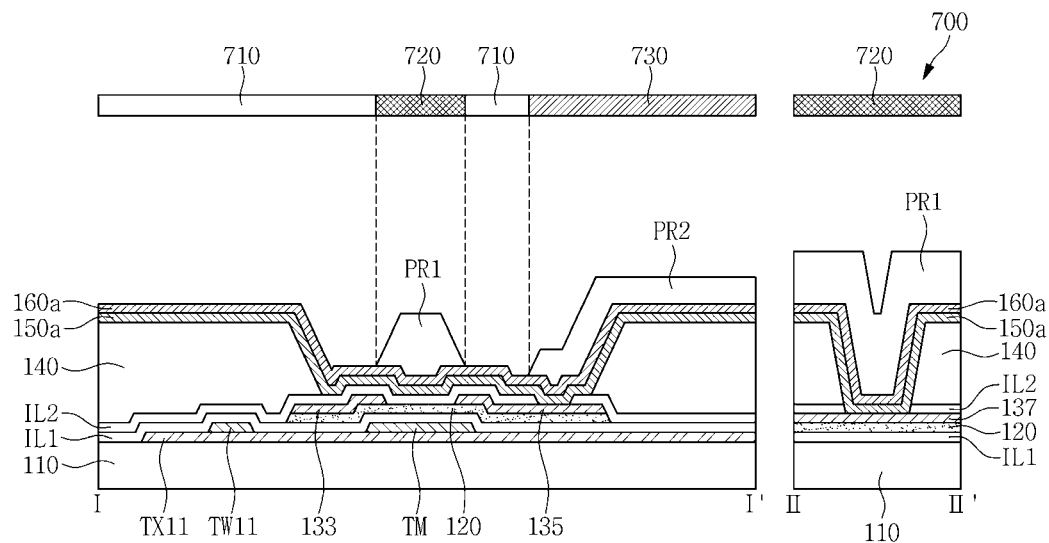

Referring to FIGS. 4D and 5L, the photoresist PR below the light transmissive portion 710 is completely developed, and the photoresist PR below the light blocking portion 720 is not developed and cured as it is such that a first etching prevention layer PR1 is formed.

The photoresist PR below the semi-light transmissive portion 730 is partially developed and cured such that a second etching prevention layer PR2 is formed. Accordingly, the first etching prevention layer PR1 may have a greater thickness than that of the second etching prevention layer PR2. A portion of the gate wiring forming material 160a is exposed through the first etching preventing layer PR1 and the second etching preventing layer PR2.

Figure 5M:
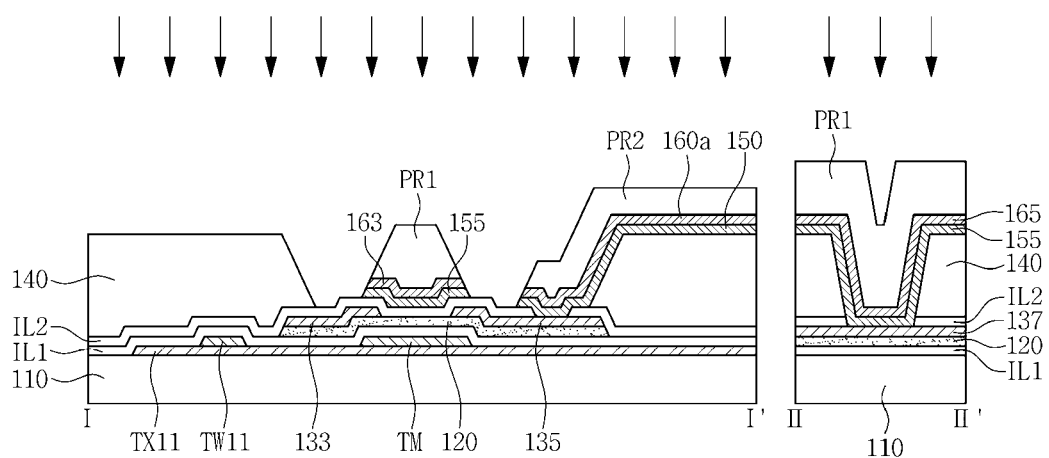

Referring to FIGS. 4D and 5M, the exposed gate wiring forming material 160a is etched, and thereafter the exposed first electric field generating electrode forming material 150a is etched. The gate wiring forming material 160a and the first electric field generating electrode forming material 150a may be etched through wet etching. Subsequently, the first etching prevention layer PR1 and the second etching prevention layer PR2 are partially removed through an ashing process.

Figure 5N:
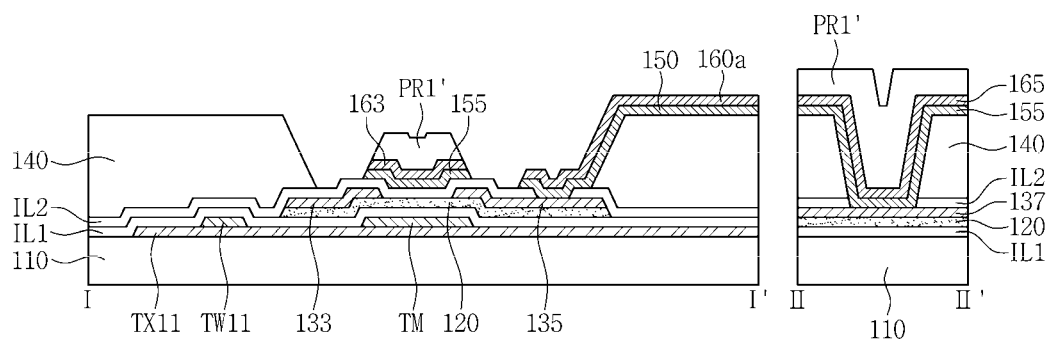

Referring to FIGS. 4D and 5N, the first etching prevention layer PR1 is partially removed such that a residual etching prevention layer PR1' is formed. The second etching prevention layer PR2 on the pixel area PA is completely removed such that the gate wiring forming material 160a on the pixel area PA is exposed.

Figure 5O:
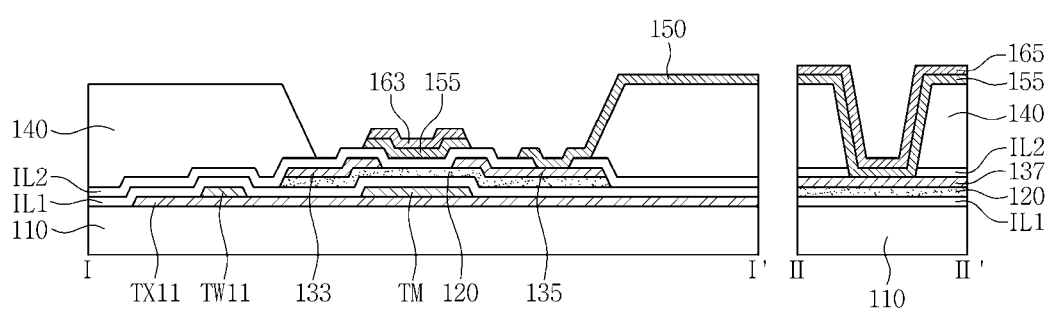

Referring to FIGS. 4D and 5O, the exposed gate wiring forming material 160a is etched such that the first electric field generating electrode 150 is formed. Since the first electric field generating electrode forming material 150a and the gate wiring forming material 160a are sequentially formed, the first electric field generating electrode forming material 150a is disposed below the gate wiring 161, 163, and 165 in direct contact with the gate wiring 161, 163, and 165.

Figure 5P:
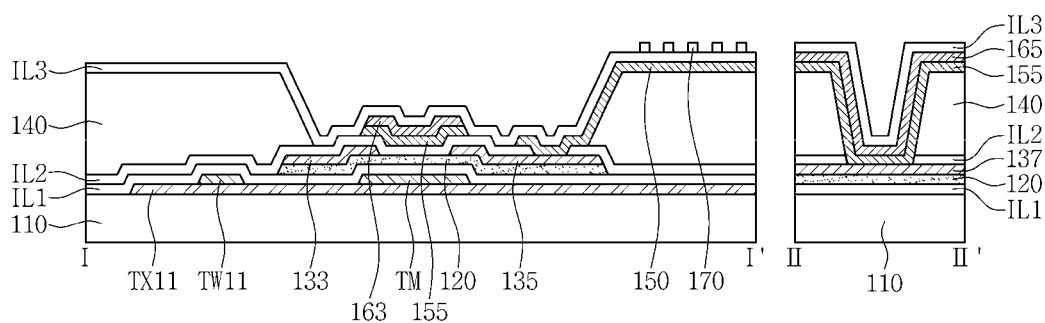

Referring to FIG. 5P, a third insulating layer IL3 is formed over the first substrate 110 on which the first electric field generating electrode 150 and the gate wiring 161, 163, and 165 are formed. Subsequently, the second electric field generating electrode 170 is formed on the third insulating layer IL3 to overlap the first electric field generating electrode 150.

As such, the display device according to exemplary embodiments may reduce the number of masks, while having a direct contact structure and an in-cell touch structure, by using a three-tone mask. Accordingly, the process may be simplified and the manufacturing costs may be reduced.

As set forth hereinabove, in one or more exemplary embodiments, the display device and the method of manufacturing the display device may reduce the number of masks, thus capable of simplifying the process and reducing the manufacturing costs.

While the present inventive concept has been illustrated and described with reference to the exemplary embodiments thereof, it will be apparent to those of ordinary skill in the art that various changes in form and detail may be made thereto without departing from the spirit and scope of the present inventive concept.

What is claimed is:

1. A display device comprising:
a substrate;
a touch electrode disposed on the substrate;
a routing wiring disposed directly on the touch electrode;
a light blocking layer disposed directly on the touch electrode;
a semiconductor layer disposed on the light blocking layer;
a source electrode and a drain electrode spaced apart from each other and disposed on the semiconductor layer; and
a gate electrode disposed on the source electrode and the drain electrode.

2. The display device as claimed in claim 1, further comprising:
a first electric field generating electrode connected to the drain electrode; and
a second electric field generating electrode insulated from the first electric field generating electrode.

3. The display device as claimed in claim 2, further comprising a lower wiring disposed below the gate electrode, the lower wiring comprising a substantially same material as a material forming the first electric field generating electrode.

4. The display device as claimed in claim 3, wherein the gate electrode directly contacts the lower wiring.

5. The display device as claimed in claim 2, wherein the first electric field generating electrode is a surface electrode.

6. The display device as claimed in claim 2, wherein the second electric field generating electrode comprises a stem portion and branch portions obliquely extending from the stem portion.

7. The display device as claimed in claim 1, further comprising an organic layer disposed on the source electrode and the drain electrode.

8. The display device as claimed in claim 5, wherein the organic layer is not disposed on a channel area between the source electrode and the drain electrode.

9. The display device as claimed in claim 5, wherein the organic layer is not disposed on a contact through which the drain electrode and the first electric field generating electrode are connected.

10. The display device as claimed in claim 1, wherein the routing wiring and the light blocking layer comprise a substantially same material.

11. The display device as claimed in claim 1, wherein the touch electrode directly contacts the light blocking layer.

12. A method of manufacturing a display device, the method comprising:
forming a touch electrode, a routing wiring and a light blocking layer on a substrate, the routing wiring and the light blocking layer being disposed on the touch electrode and connected to the touch electrode;
forming a semiconductor layer on the light blocking layer;
forming a source electrode and a drain electrode spaced apart from each other on the semiconductor layer;
forming an organic layer on the source electrode and the drain electrode; and
forming a gate electrode on the source electrode and the drain electrode,
wherein a distance between the touch electrode and the routing wiring is the same as a distance between the touch electrode and the light blocking layer.

13. The method as claimed in claim 12, wherein the forming the gate electrode further includes forming a first electric field generating electrode connected to the drain electrode.

14. The method as claimed in claim 13, further comprising forming a second electric field generating electrode insulated from the first electric field generating electrode and overlapping the first electric field generating electrode.

15. The method as claimed in claim 14, wherein the forming the gate electrode comprises:
sequentially forming a first electric field generating electrode forming material and a gate electrode forming material over the source electrode and the drain electrode;
forming a photoresist layer over the gate electrode forming material;
exposing the photoresist layer using a mask comprising a light transmissive portion, a semi-light transmissive portion, and a light blocking portion;
developing the exposed photoresist layer;
etching the first electric field generating electrode forming material and the gate electrode forming material using the developed photoresist layer as a mask;
partially ashing the developed photoresist layer; and
etching the gate electrode forming material using the ashed photoresist layer as a mask.

16. The method as claimed in claim 15, wherein the forming the touch electrode, the routing wiring, and the light blocking layer comprise:
sequentially forming a touch electrode forming material, a routing wiring and light blocking layer forming material, and a photoresist layer over the substrate;
exposing the photoresist layer using a mask comprising a light transmissive portion, a semi-light transmissive portion, and a light blocking portion;
developing the exposed photoresist layer;
etching the touch electrode forming material and the routing wiring and light blocking layer forming material using the developed photoresist layer as a mask;
partially ashing the developed photoresist layer; and
etching the routing wiring and light blocking layer forming material using the ashed photoresist layer as a mask as a mask.

17. The method as claimed in claim 16, wherein the forming the organic layer comprises:
forming an organic layer forming material over the source electrode and the drain electrode;
exposing the organic layer forming material using a mask comprising a light transmissive portion, a semi-light transmissive portion, and a light blocking portion;
developing the exposed organic layer forming material;
exposing the drain electrode using the developed organic layer forming material as a mask; and
ashing the developed organic layer forming material on a channel area between the source electrode and the drain electrode.

18. The method as claimed in claim 14, wherein the forming the organic layer comprises:
forming an organic layer forming material over the source electrode and the drain electrode;
exposing the organic layer forming material using a mask comprising a light transmissive portion, a semi-light transmissive portion, and a light blocking portion;
developing the exposed organic layer forming material;
exposing the drain electrode using the developed organic layer forming material as a mask; and
ashing the developed organic layer forming material on a channel area between the source electrode and the drain electrode.

19. The display device as claimed in claim 1, wherein the semiconductor layer includes a channel area between the source electrode and the drain electrode.

20. The method as claimed in claim 12, wherein the semiconductor layer includes a channel area between the source electrode and the drain electrode.

21. The display device as claimed in claim 1, further comprising a first electric field generating electrode connected to the drain electrode, wherein at least one portion of the touch electrode is disposed between the substrate and the first electric field generating electrode.

22. The method as claimed in claim 12, wherein,
the forming the gate electrode further includes forming a first electric field generating electrode connected to the drain electrode,
at least one portion of the touch electrode is disposed between the substrate and the first electric field generating electrode.

* * * * *